(12) United States Patent
Boerner

(10) Patent No.: US 7,990,055 B2
(45) Date of Patent: Aug. 2, 2011

(54) ELECTROLUMINESCENT ARRANGEMENT HAVING DETACHED ELECTRODE AND METHOD OF FABRICATING THE SAME

(75) Inventor: Herbert Friedrich Boerner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 222 days.

(21) Appl. No.: 12/281,529

(22) PCT Filed: Feb. 21, 2007

(86) PCT No.: PCT/IB2007/050552
§ 371 (c)(1),
(2), (4) Date: Feb. 11, 2009

(87) PCT Pub. No.: WO2007/099476
PCT Pub. Date: Sep. 7, 2007

(65) Prior Publication Data
US 2009/0212685 A1 Aug. 27, 2009

(30) Foreign Application Priority Data

Mar. 3, 2006 (EP) ..................................... 06110668
May 18, 2006 (EP) ..................................... 06114135

(51) Int. Cl.
*H05B 33/02* (2006.01)
*H05B 33/14* (2006.01)
(52) U.S. Cl. ........ 313/506; 313/504; 313/509; 313/512; 428/690; 428/917; 445/24; 445/25

(58) Field of Classification Search .................. 313/504, 313/506, 512
See application file for complete search history.

(56) References Cited

U.S. PATENT DOCUMENTS

| | | | |
|---|---|---|---|
| 5,505,985 A | 4/1996 | Nakamura et al. | |
| 6,413,645 B1 | 7/2002 | Graff et al. | |
| 6,605,372 B1 * | 8/2003 | Kubota | 427/66 |
| 7,170,087 B2 * | 1/2007 | Kidokoro et al. | 257/40 |
| 2004/0185673 A1 * | 9/2004 | Ichijo et al. | 438/758 |
| 2004/0247938 A1 * | 12/2004 | Yamaguchi et al. | 428/690 |

FOREIGN PATENT DOCUMENTS

| | | |
|---|---|---|
| EP | 0893939 A1 | 1/1999 |
| JP | 05129080 A | 5/1993 |
| JP | 11307251 | 1/1999 |
| JP | 11162634 A | 6/1999 |
| JP | 11312580 | 11/1999 |
| JP | 2006004770 | 11/2006 |
| WO | 2005006441 A1 | 1/2005 |

* cited by examiner

Primary Examiner — Sikha Roy

(57) ABSTRACT

An electroluminescent arrangement comprising a substrate (1), at least one layered structure applied to the substrate that comprises at least one organic electroluminescent layer (2) for emitting light (10) that is arranged between a first electrode (3) arranged on the side on which the substrate is situated and a second electrode (4) arranged on the side of the electroluminescent layer (2) remote from the substrate, and an electrically insulating layer (5) of a material that is chemically reactive with the organic electroluminescent layer (2), suitable for detaching the second electrode (4) from the organic electroluminescent layer (2) in a confined region around a hole defect.

20 Claims, 2 Drawing Sheets

ELECTROLUMINESCENT ARRANGEMENT HAVING DETACHED ELECTRODE AND METHOD OF FABRICATING THE SAME

The invention relates to an electroluminescent arrangement having an organic luminescent layer and an encapsulating layer for passivating the arrangement electrically.

Organic electroluminescent arrangements (organic EL arrangements) comprise a layered structure (EL structure) that is applied to a substrate and that comprises an organic luminescent layer (an OLED layer), a hole-conducting layer, an anode and a cathode. The typical thicknesses of the layers are of the order of 100 nm. The typical voltages applied to the EL structure are between 2 V and 10 V. Situated between the OLED layer and the cathode, there is, in addition, an electron injection layer of a material having a low work function, such for example as barium. There are two possible effects that, over time, have an adverse effect on the emitting properties of the organic EL arrangement and these are, on the one hand, the growth of dark, non-emitting regions (degradation of the EL arrangement with time) and, on the other hand, the sudden failure of the entire arrangement as a result of leakage currents or short-circuits between the cathode and anode. In the prior art, the degradation of an organic EL arrangement as a result of the growth of dark regions has been attributable to a reaction on the part of the layered structure to water/moisture, a reaction that increases as temperature rises. The EL structures are therefore encapsulated mechanically and the space between the encapsulation and the EL structure is filled with dry gases that are totally chemically inert to the entire layered structure. The mechanical encapsulation prevents any further reduction in the overall depth of organic LEDs, stops the mechanical flexibility of organic layers from being exploited and, being an additional component, makes organic LEDs more expensive to produce, particularly where what are concerned are large-area OLEDs.

To protect the organic LED against the infiltration of water and oxygen, document U.S. Pat. No. 5,505,985 discloses additional coating of the original organic LED with a covering layer of an electrically insulating material. The material of this protective layer is particularly suitable for preventing the diffusion of moisture into the layers situated beneath it. The application of the protective layer preferably takes place in a vacuum, because the protective layer must not attack either the organic luminescent layer or the electrode adjacent the protective layer in the course of the application process. Electroluminescent arrangements having protective layers of this kind are subject to a lower decline in brightness relative to their initial brightness than electroluminescent arrangements not having a protective layer of this kind.

However, a major advantage of organic EL arrangements is the possibility of being able to produce thin light sources covering a large area. It is precisely in the case of large-area OLED layers covering a few square centimeters or more that the presence of particles, of dust for example, is unavoidable during the production process. Particles present on the substrate, such for example as dust particles of a diameter substantially greater than the thickness of the electroluminescent layer, cause hole defects whose edges are of an undefined nature when such layers are being produced. No layered structure, or only a part of it, is present inside such holes. These defects result in unacceptable leakage currents and short-circuits between the cathode and anode. The short-circuits generally do not occur in this case until, in the course of operation of the OLEDs, the operating voltage has to be increased, due to a decline in light yield, to allow the same amount of light to be generated. In contrast to a slow degradation of brightness due to the infiltration of oxygen or water into the light-emitting layers, failures of electroluminescent arrangements as a result of short-circuits in the region of hole defects become apparent as a sudden drop in brightness to zero. It is precisely in the case of large-area EL arrangements that short-circuits in the region of hole defects are by far the commonest cause of EL arrangements failing. Protection simply against the infiltration of moisture or oxygen has no appreciable effect on the failure rate.

It is therefore an object of the present invention to provide effective and simple protection for organic EL arrangements that gives an appreciable reduction in the failure rate caused by leakage currents and short-circuits.

This object is achieved by an electroluminescent arrangement comprising a substrate, at least one layered structure applied to the substrate that comprises at least one organic electroluminescent layer for emitting light that is arranged between a first electrode arranged on the side on which the substrate is situated and a second electrode arranged on the side of the electroluminescent layer remote from the substrate, and an electrically insulating layer of a material that is chemically reactive with the organic electroluminescent layer, suitable for detaching the second electrode from the organic electroluminescent layer in a confined region around a hole defect.

A hole defect means a region in which no material was deposited during the process of producing the electroluminescent arrangement. The cause of a hole defect is for example a particle of dust that, due to shading-off effects in one or more directional coating processes, results in no material being deposited in the region around the dust particle. If the cause of a hole defect is already present during the process of applying the organic electroluminescent layer, then the organic material too will be missing in the region of the hole defect and the possibility will exist of a short-circuit between the two electrodes. The likelihood of a short-circuit depends on the local strength of the electrical field in the region of the hole defect during the operation of the electroluminescent arrangement. Because the second electrode is irregularly shaped in the region of the edge of such a hole defect and may therefore have pointed edges, there is a danger at this point of a marked rise in the field strength and of a subsequent flashover. This flashover may itself be the reason for the failure of the electroluminescent arrangement, or else it produces conductive bridges and self-amplifying leakage currents that flow in the bridges and that later result in a short-circuit and hence in the failure of the electroluminescent arrangement. As far as the risk of short-circuits between both circuits is concerned, it is immaterial whether the cause of the hole defect is still situated in the region of the hole defect once the electroluminescent arrangement has been completed.

As a result of the detachment of the second electrode from the electroluminescent layer that, seen from the substrate, is situated below the said second electrode, the second electrode curves away from the first anode due to in-layer stresses in the region round the hole defect and thus increases the distance between it and the first electrode, which results in a marked reduction in the field strength between the two electrodes in the region of the hole defect. Due to the curving of the second electrode, it is particularly the sharp edges of the second electrode at the rim of the hole that are moved a particularly long way away from the first electrode, which gives at least an appreciable reduction in the risk of a short-circuit and thus an appreciably reduced failure rate particularly for large-area electroluminescent arrangements.

The insulating layer comprises in this case a material that has an electrical resistance that is at least as high as the electrical resistance of the layer (or layers) situated between the electrodes, so that no leakage currents between the electrodes will flow away through the insulating layer. At the same time it is a material that attacks the organic layers, in order to reduce the adhesion to the second electrode in such a way that the second electrode detaches from the organic layer in the region of the hole defect. These conditions are met by, for example, various polymers such as epoxy resins, polyimides, acrylates, phenolates, etc.

In one embodiment, the electrically insulating layer is chemically inert to the second electrode so that the insulating layer adhering to the second electrode will not attack the undamaged regions of the second electrode. A second electrode of which large areas are undamaged is required for the brightness that has to be produced by the electroluminescent arrangement.

In another embodiment, the second electrode comprises aluminum or a material containing aluminum. These categories of material are notable for having an in-layer stress within the layered structure that causes a desired curving of the detached parts of the second electrode that is particularly large.

In a further embodiment, the electrically insulating layer is applied at ambient pressure. This gives lower process costs than vacuum coatings such as are used for the electrodes and the organic layers for example, and enables application to take place in the form of a liquid. If the material of the electrically insulating layer is applied to the layered structure as a solution in a plasticizer, it is able to fill the entire region of the hole defect regardless of any dust particles that may still be clinging to the layers and is thus able to detach the second electrode in the whole of the region of the hole defect.

In a further embodiment, the electrically insulating layer is solidified by means of thermal or optical processes. By a solidifying operation, a defined stop can be put to the process by which the second electrode detaches from the organic layers situated beneath it, and the incipient growth of those regions that, due to the attack on the organic electroluminescent layer and the detached second electrode, are unable to emit any light, can be confined to the area that is required to prevent short-circuits. A thermal solidifying process is for example the thermal evaporation of the plasticizer in the electrically insulating layer. Another thermal solidifying process is the curing of two-component materials. An optical solidifying process is for example illumination with ultraviolet light.

In an alternative embodiment, the material of the electrically insulating layer is applied in the form of a two-component mixture. The two-component mixture comprises in this case a hardener and a binder. The advantage lies in the fact that the insulating layer solidifies by itself without a further process step.

In a further embodiment, the electrically insulating layer is of a mean thickness of more than 1000 nm, to ensure that the electrically insulating layer covers the underlying layered structure as a continuous electrically insulating layer, for filling all the regions of a hole defect with an adequate amount of the material of the electrically insulating layer.

In a further embodiment, a further passivating means is applied to the electrically insulating layer. This passivating means is intended to protect the electrically insulating layer against mechanical damage such for example as scratches and against chemical effects such for example as the infiltration of oxygen or moisture, which is to be prevented. A passivating means of this kind may for example be a mechanical encapsulation having a volume of space around the electroluminescent arrangement that is filled with an inert material, an inert liquid or an inert gas.

In a further embodiment, the passivating means is an organic layer applied to the electrically insulating layer that has a negligible diffusion rate for oxygen or water, such for example as an organic resin. In contrast to arrangements having a mechanical encapsulation (a cover), this allows an organic LED to retain its mechanical flexibility.

These and other aspects of the invention are apparent from and will be elucidated with reference to the embodiments described hereinafter.

Figure 1:
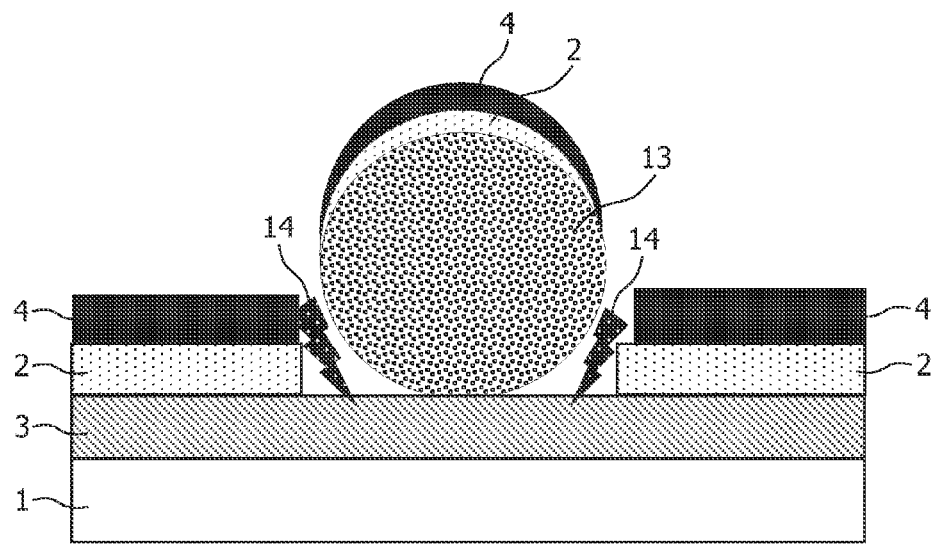
FIG. 1 is a schematic view of the layered structure in the region of a hole defect.

The layered structure of an EL arrangement comprises at least individual thin layers 2, 3 and 4 that are typically produced by dry, directional coating processes such for example as vacuum deposition and/or sputtering. In directional coating processes of this kind, the presence of particles 13, such as particles of dust for example, results in the substrate or the part of the layered structure that is to be coated being shaded off, and hence in hole defects as shown in FIG. 1. The diameters of such particles (which are not necessarily spherical as shown in FIG. 1) are usually appreciably greater that the thicknesses of the individual layers. Because of the shading-off during the coating process, none, or only part, of the layered structure of the EL arrangement is present within the hole defects. The size and shape of the hole defects depend on the position and geometry of the particles 13 and on the time as from which the particle 13 was present on the growing layered structure during the production of the thin layers. If, due to a particle 13, the high-resistance organic electroluminescent layer 2 is no longer present in the region of a hole defect, then flashovers 14 may occur between the two electrodes 3 and 4. At a typical operating voltage of 2 to 10 V between the electrodes and a typical electrode spacing of 100 nm, there is a field of 20-100 kV/mm at the EL structure. Even locally, the edges of a hole defect produce substantially higher field strengths due to the very small radius of curvature of the layer edges at the hole defect. The difference between the dielectric constants of the organic luminescent layer ($\in$~3) and of the material in the region of the hole, which is typically air ($\in$=1), causes a further increase in field strength in the critical region of the edges of the layer defect. In addition, the dielectric strength of air is considerably lower than that of the organic luminescent layer, which further increases the risk of an electrical flashover. As well as producing an uncontrolled flow of current, a flashover 14 between the electrodes 3 and 4 also causes local heating-up of the layered structure that, in the organic luminescent layer 2, may result in carbon being released locally. This carbon settles at the edges of a hole defect and increases the electrical conductivity at the edge of the hole defect, which encourages the occurrence of further flashovers or leakage currents to an even greater degree. This self-amplifying process leads to the EL arrangement being destroyed. The occurrence of this process does not depend on whether, depending on the embodiment of the EL structure, there is one or more than one organic layer between the anode and the cathode.

In one embodiment, the layered structure of the electroluminescent arrangement includes a thin package of organic layers having an electroluminescent layer 2 (such for example as doped tris-(8-hydroxyquinoline) aluminum of a typical thickness in the region of 100 nm, that is arranged between two electrodes (such for example as an anode 3 and a cathode 4, as shown in FIG. 1), of which at least one is transparent to allow the light generated to be coupled out. Indium tin oxide (ITO) is usually used as a transparent, conductive electrode material. What is used as the non-transparent electrode is a conductive material, such as a layer of aluminum for example, of a thickness of the order of 100 nm. There are however also arrangements in which both electrodes are transparent. The layered structure 2, 3 and 4 is applied to a substrate 1. A distinction is made in this case between top emitters and bottom emitters. Bottom emitters emit the luminescent light through the substrate 1. In this case the anode 3 comprises a layer of ITO and the cathode 4 a layer of aluminum. The layered structure may also be applied to the substrate in the reverse order. A top emitter of this kind then emits the light not through the substrate, as shown in FIG. 1, but in the opposite direction. In this case the transparent electrode on the side remote from the substrate may comprise a transparent material or a sufficiently thin layer of metal. Arranged between the organic luminescent layer 2 and the anode 4 there is generally an organic hole-conducting layer, typically of alpha-NPD (N,N'-di-(naphthalene-2-yl)-N,N'-diphenyl benzidene) of a thickness of approximately 50 nm (not shown in FIG. 1 in the present case). Situated between the cathode 4 and the organic luminescent layer 2 there is usually a thin electron injection layer of a material having a low work function, such for example as lithium, cesium or barium, which layer (also not shown in FIG. 1) is important for good injection of electrons into the luminescent layer. This electron injection layer reacts very sensitively to moisture. The materials that have been specified by way of example for the present embodiment may be replaced, in other embodiments, by other materials known from the prior art.

Figure 3:
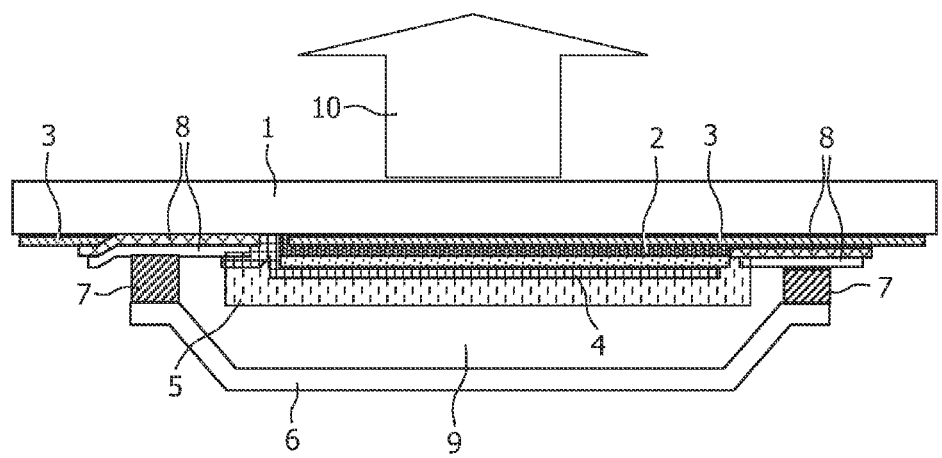
FIG. 3 shows an embodiment of the electroluminescent arrangement according to the invention having mechanical encapsulation.

The likelihood of hole defects increases with the area of the organic EL arrangement. An advantage of organic luminescent layers is however precisely the large-area configuration that is possible with them. However, large-area organic EL arrangements can only be produced with a low failure rate when flashovers can be prevented between the electrodes 3 and 4. The passivation of the hole regions by an electrically insulating layer 5 according to the invention having the effect shown in FIG. 3 represents an effective and inexpensive solution. The complete EL structure is covered by an electrically insulating layer 5.

To reduce the risk of flashovers between the electrodes 3 and 4, the material of the electrically insulating layer should have an appreciably higher dielectric constant than air. What are therefore advantageous are materials for which $4.5 > \epsilon > 1.5$. The materials should also have an appreciably higher dielectric strength than air (~4-5 kV/mm).

For successful electrical passivation by the electrically insulating layer 5 to take place in the regions of the hole defects, during the application process the electrically insulating layer 5 must entirely displace the gases that are still present in the regions of the hole defects between the edges of the holes and the particles 13 that may possibly still be clinging on them. To enable it to penetrate into cavities that may possibly be small, the liquid electrically insulating layer 5 must have a surface tension that is sufficiently low. Particularly advantageous in this case are appropriate liquids having a surface tension of less than $2.5*10^{-2}$ N/m. In addition to its passivating effect, the electrically insulating layer 5 may also be used to dissipate the heat generated by the electroluminescent arrangement in operation, by means of heat-transmitting contact.

By means of the passivation according to the invention of the electroluminescent arrangement, it has been possible for the failure rate due to leakage currents and flashovers between the electrodes 3 and 4 to be brought down by factors in comparison with electroluminescent arrangements not having an electrically insulating layer 5. This improvement was achieved by virtue of the fact that the material of the electrically insulating layer 5 chemically attacks the organic electroluminescent layer 2 or, in the case of a system of organic layers, at least the organic layer adjacent to the second electrode, and in this way causes the second electrode 4 to detach from the organic layer 2 or the system of organic layers in a region 4a around the hole defect. In other embodiments, the material of the electrically insulating layer 5 may also be part of the organic layer 2 or may dissolve the whole organic layer 2 in a region around the hole defect. After the detachment process, in-layer stresses in the second electrode 4 in a region 4a of the electrode cause the second electrode to curve away from the organic electroluminescent layer 2 and from the first electrode 3. This greatly increases the distance between the second electrode 4a and the first electrode 3 and thus at least appreciably reduces the field strength. As a result of the detachment process, any sharp edges the second electrode 4a may have at the edge of the hole defect point away from the first electrode, which means that an excessive increase in field strength no longer occurs in this region. During the detachment process, the material of the electrically insulating layer 5 must be sufficiently fluid to fill the volume of space that is created between the second electrode 4 and the organic electroluminescent layer 2 as a result of the detachment process, so that no gas bubbles of reduced dielectric strength are produced between the electrodes 3 and 4. The liquid or flowable electrically insulating layer 5 is then dried or otherwise solidified as the case may be. Depending on the material of the electrically insulating material, this may be done thermally by evaporating the solvent or by means of optical solidification, by ultraviolet radiation for example.

Figure 2:
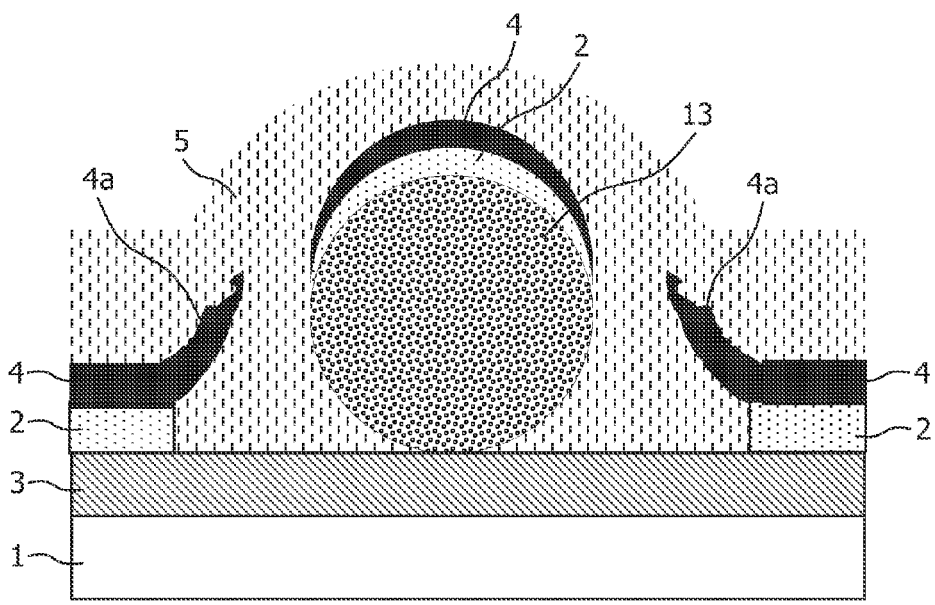
FIG. 2 shows an electroluminescent arrangement according to the invention that has an appreciably reduced failure rate due to short-circuits and leakage currents.

Epoxy resins are an example of materials that are suitable for the electrically insulating layer 5. These materials form a thin film on the second electrode 4. As a result of the curving-up of the second electrode, there form, in the region of hole defects, bumps of the form shown schematically in FIG. 2 that are completely filled with the solution. After the solidification process, the electroluminescent arrangement according to the invention was operating without any short-circuits occurring even at high operating voltages. Voltages of up to 10 volts were applied in this case. The layer thickness should be at least 1 µm to produce the effect according to the invention and for production reasons should not be more than 1000 µm, and should preferably be between 10 µm and 100 µm.

The electrical passivation that is achieved in this way can be used for all organic electroluminescent arrangements made of organic small-molecule materials (so-called SMOLEDs) or polymers. Large-area organic electroluminescent arrangements in particular benefit from the lower sensitivity to dust particles, which gives lower production costs due to the avoidance of expensive clean-room conditions. The invention can be used for displays, illuminated signs or lighting purposes in general.

FIG. 3 is a view from the side of a further embodiment of an electroluminescent arrangement according to the invention, namely an encapsulated electroluminescent arrangement. In this case it is provided with an encapsulating device (passivating means) to give protection against ambient moisture. The said passivating means comprises a cover 6 that, by means of adhesive-bonded connections 7, encloses the layered structure having the organic luminescent layer 2 and is solidly connected thereto. The volume of space 9 is filled with dry gases, such as inert gases for example, or with dry liquids, such as dielectric liquids for example. A getter material may also be arranged inside the encapsulation to reduce the amount of moisture/water in the volume of space 9. The electroluminescent arrangement emits light 10 through a transparent first electrode 3 and a transparent substrate 1 (a bottom emitter). In other embodiments the encapsulation may also take other forms. To allow the layered structures situated inside the encapsulation to be driven electrically, conductors 8 and 3 are run out of the encapsulation. In addition to the layered structure shown in FIG. 1, there may also be additional layers, such as micro-cavity layers to improve the coupling out of the light. These possible additional layers do not in any way change the manner according to the invention that has been described of achieving the basic object.

Figure 4:
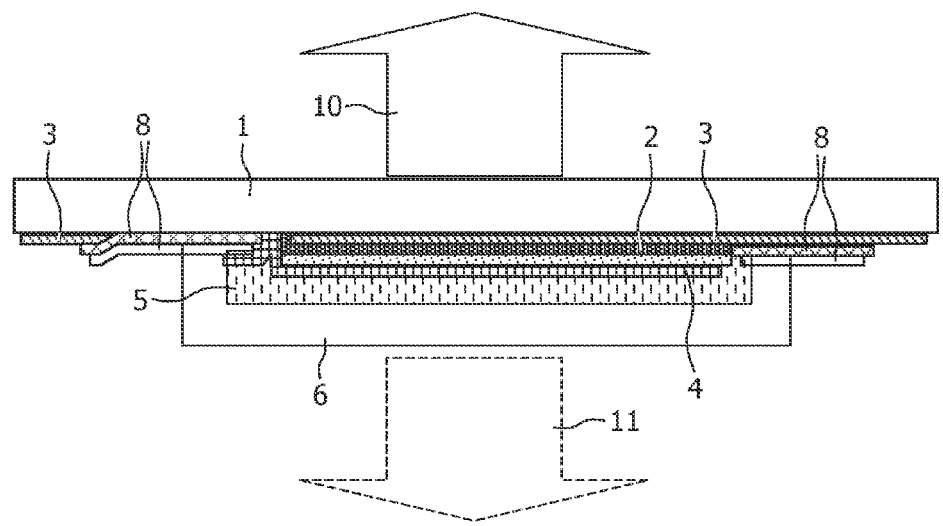
FIG. 4 shows an embodiment of the electroluminescent arrangement according to the invention having a protective layer and no mechanical encapsulation.

The mechanical encapsulation shown in FIG. 3 for preventing the emitting properties of the electroluminescent arrangement from becoming degraded as a result of the infiltration of moisture or oxygen into the organic layers can, in another embodiment, be replaced by a passivating means 6 in the form of an additional organic layer 6 that is applied to the electrically insulating layer 5, see FIG. 4. When there is a transparent electrically insulating layer 5, of epoxy resin for example, and a transparent passivating means 6, of glass for example, the electroluminescent arrangement is also able, in further embodiments, to emit light 11 towards the side remote from the substrate (what is termed a top emitter). In this case the transparent insulating layer acts as an adhesive for the glass. The glasses that are used as a transparent, glass passivating means 6 may for example be the same glasses as are used as glass substrates for the layered structure. The glass may encapsulate the layered structure as a box-like shape in this case, as shown in FIG. 4, or may be applied to the insulating layer as a plane layer, in which case the lateral edges of the layered structure then have to be closed off by means of an adhesive-bonded connection similar to the adhesive-bonded connection 7 shown in FIG. 3.

A different approach to achieving the basic object of the present invention, namely by reducing the number of layer defects by means of very costly clean-room technology, would mean a steep rise in production costs and is unable to completely prevent layer defects from occurring precisely in the case of large-area EL arrangements.

The embodiments that have been elucidated by reference to the drawings and in the description are only examples of an electroluminescent arrangement according to the invention for appreciably reducing the failure rate due to leakage currents and short-circuits and are not to be construed as limiting the claims to these examples. Alternative embodiments are also conceivable by the person skilled in the art, and these too are covered by the scope of the claims. The numbering of the dependent claims is not intended to imply that other combinations of the claims do not also constitute advantageous embodiments of the invention. Also, the use of the words "a", "an" or "one" in the description and claims does not rule out the possibility of there being more than one of the arrangements, units or elements.

The invention claimed is:

1. An electroluminescent arrangement comprising:
    a substrate;
    at least one layered structure applied to the substrate, the layered structure comprising at least one organic electroluminescent layer for emitting light disposed between a first electrode arranged proximate to the substrate and a second electrode arranged over the electroluminescent layer distal from the substrate; and
    an electrically insulating layer comprising a material that is chemically reactive with the organic electroluminescent layer and suitable for detaching the second electrode from the organic electroluminescent layer in a confined region around a hole defect, wherein the detached second electrode curves away from the first electrode in the confined region around the hole defect.

2. The electroluminescent arrangement as claimed in claim 1, wherein the electrically insulating layer is chemically inert to the second electrode.

3. The electroluminescent arrangement as claimed in claim 1, wherein the second electrode comprises or consists essentially of aluminum.

4. The electroluminescent arrangement as claimed in claim 1, wherein the electrically insulating layer is applied to the layered structure at ambient pressure.

5. The electroluminescent arrangement as claimed in claim 1, the electrically insulating layer is applied to the layered structure as a solution.

6. The electroluminescent arrangement as claimed in claim 5, wherein the electrically insulating layer is solidified by means of at least one of thermal and/or optical processes.

7. The electroluminescent arrangement as claimed in claim 1, wherein the electrically insulating layer comprises a two-component mixture.

8. The electroluminescent arrangement as claimed in claim 1, wherein the electrically insulating layer has a mean thickness of more than 1000 nm.

9. The electroluminescent arrangement as claimed in claim 1, further comprising a passivating means applied to the electrically insulating layer.

10. The electroluminescent arrangement as claimed in claim 9, wherein the passivating means is an organic layer having a negligible diffusion rate for at least one of oxygen and water.

11. An electroluminescent arrangement comprising:
    a substrate;
    a layered structure comprising a first electrode arranged on the substrate, an organic electroluminescent layer arranged on the first electrode, and a second electrode arranged on the organic electroluminescent layer, wherein a hole defect extends through at least the second electrode of the layered structure; and
    an electrically insulating layer arranged on the layered structure and contacting the organic electroluminescent layer at edges of the hole defect, the electrically insulating layer comprising a material that is chemically reactive with the organic electroluminescent layer such that the second electrode is detached from the organic electroluminescent layer and curves away from the first electrode at the edges of the hole defect.

12. The electroluminescent arrangement of claim 11, further comprising:
    a cover enclosing the layered structure and the electrically insulating layer, the cover defining a volume of space filled with a dry gas.

13. The electroluminescent arrangement of claim 11, further comprising:
a passivating organic layer formed on the electrically insulating layer.

14. A method of forming an electroluminescent arrangement, the method comprising:
applying a first electrode layer to a substrate;
applying an electroluminescent layer to the first electrode;
applying a second electrode layer to the organic electroluminescent layer, a hole defect extending through at least the second electrode layer and exposing a portion of the electroluminescent layer at edges of the hole defect; and
applying an electrically insulating layer over the second electrode layer, a material of the electrically insulating layer chemically reacting with the exposed portion of organic electroluminescent layer at the edges of the hole defect, reducing an adhesion between the second electrode layer and the organic electroluminescent layer, and causing the second electrode layer to detach from the organic electroluminescent layer at the edges of the hole defect and to curve away from the first electrode layer.

15. The method of claim 14, wherein the electrically insulating layer is applied at ambient pressure.

16. The method of claim 15, wherein the electrically insulating layer is applied as a liquid, enabling the electrically insulating layer to fill a volume of space of the hole defect.

17. The method of claim 16, further comprising:
solidifying the electrically insulating layer liquid by at least one of a thermal process and an optical process.

18. The method of claim 14, wherein the electrically insulating layer is applied in the form of a two-component mixture.

19. The method of claim 14, wherein the electrically insulating layer has a mean thickness of more than 1000 nm.

20. The method of claim 14, further comprising:
applying passivating means to the electrically insulating layer.

* * * * *